(12) United States Patent
Kim

(10) Patent No.: US 8,582,385 B2
(45) Date of Patent: Nov. 12, 2013

(54) SEMICONDUCTOR MEMORY DEVICE

(75) Inventor: Young Joo Kim, Hwaseong-si (KR)

(73) Assignee: SK Hynix Inc., Gyeonggi-do (KR)

( * ) Notice: Subject to any disclaimer, the term of this patent is extended or adjusted under 35 U.S.C. 154(b) by 72 days.

(21) Appl. No.: 13/412,776

(22) Filed: Mar. 6, 2012

(65) Prior Publication Data

US 2013/0033952 A1 Feb. 7, 2013

(30) Foreign Application Priority Data

Aug. 5, 2011 (KR) ........................ 10-2011-0078294

(51) Int. Cl.
*G11C 5/14* (2006.01)

(52) U.S. Cl.
USPC ................ 365/226; 365/189.09; 365/211

(58) Field of Classification Search
USPC ....................................... 365/211
See application file for complete search history.

(56) References Cited

U.S. PATENT DOCUMENTS

| 5,499,209 | A | * | 3/1996 | Oowaki et al. | 365/189.11 |
| 5,808,953 | A | * | 9/1998 | Kim et al. | 365/226 |
| 6,434,078 | B1 | * | 8/2002 | Morishita | 365/227 |
| 6,600,692 | B2 | * | 7/2003 | Tanzawa | 365/226 |
| 6,876,585 | B2 | * | 4/2005 | Choi et al. | 365/189.09 |

FOREIGN PATENT DOCUMENTS

| KR | 100123827 B1 | 9/1997 |
| KR | 10-0825769 B1 | 4/2008 |
| KR | 100881719 B1 | 1/2009 |
| KR | 1020100006398 A | 1/2010 |

\* cited by examiner

*Primary Examiner* — Tan T. Nguyen
(74) *Attorney, Agent, or Firm* — William Park & Associates Patent Ltd.

(57) ABSTRACT

A semiconductor memory device includes: a reference voltage generation unit configured to generate first and second reference voltages, wherein a level of the first reference voltage increases with decreasing internal temperature, and a level of the second reference voltage decreases with decreasing internal temperature; and a level control unit configured to control an internal voltage in response to the first and second reference voltages so as to decrease the absolute value of the internal voltage.

25 Claims, 3 Drawing Sheets

SEMICONDUCTOR MEMORY DEVICE

CROSS-REFERENCES TO RELATED APPLICATIONS

The present application claims priority under 35 U.S.C 119(a) to Korean Application No. 10-2011-0078294, filed on Aug. 5, 2011, in the Korean intellectual property Office, which is incorporated herein by reference in its entirety set forth in full.

BACKGROUND

To perform an internal operation, a semiconductor memory device receives an external voltage such as a supply voltage VDD and a ground voltage VSS from outside, and generates an internal voltage to be used for the internal operation. The internal voltage of the memory device may include a core voltage VCORE supplied to a memory core region, a high voltage VPP used for driving a word line, and a back bias voltage VBB supplied as a bulk voltage of an NMOS transistor of the core region.

The core voltage VCORE may be generated by lowering the supply voltage VDD to a predetermined level. However, the high voltage VPP has a higher level than the supply voltage VDD inputted from outside, and the back bias voltage VBB has a lower level than the ground voltage VSS inputted from outside. Therefore, a charge pump circuit is required to supply charges for generating the high voltage VPP and the back bias voltage VBB.

An internal voltage used in a semiconductor memory device may include a negative word line voltage VNWL. The negative word line voltage VNWL is a voltage which is supplied to a word line in a state such as a precharge state in which the word line is not selected, and maintains a lower level than the ground voltage VSS to thereby reduce a leakage current without increasing the threshold voltage of a memory cell transistor.

When a leakage current occurs between a word line and a bit line (e.g., a leakage current due to a bridge between the word line and the bit line) in a state in which the negative word line voltage VNWL is applied to the word line, a potential difference between the word line and the bit line increases in proportion to the absolute value of the negative word line voltage VNWL. Furthermore, the threshold voltage of a memory cell becomes high at low temperature, and thus the potential difference between the word line and the bit line becomes large. Accordingly, a leakage current may increase.

Since the negative word line voltage VNWL is generated at a constant level regardless of temperature, the leakage current further increases at low temperature than at high temperature, thereby degrading a refresh characteristic.

SUMMARY

An embodiment of the present invention relates to a semiconductor memory device which increases the absolute value of a negative word line voltage at low temperature and reduces a leakage current occurring in a bridge, thereby improving a refresh characteristic.

In an embodiment, a semiconductor memory device includes: a reference voltage generation unit configured to generate a first reference voltage whose level increases with a decrease in internal temperature and a second reference voltage whose level decreases with a decrease in the internal temperature; and a level control unit configured to control an internal voltage in response to the first and second reference voltages such that the absolute value of the internal voltage decreases.

In an embodiment, a semiconductor memory device includes: an internal voltage generation circuit configured to generate an internal voltage which has a negative level and is applied to an unselected word line; and an internal voltage control circuit configured to control the internal voltage such that the absolute value of the internal voltage decreases with a decrease in internal temperature, in response to a first reference voltage whose level increases with a decrease in the internal temperature and a second reference voltage whose level decreases with a decrease in the internal temperature.

In an embodiment, a semiconductor memory device includes: a first voltage division section configured to divide a first reference voltage whose level increases with a decrease in internal temperature and generate a first divided voltage; a divided voltage control section configured to control a level of a second divided voltage to the same level as the first divided voltage; and a second voltage division section configured to control a level of an internal voltage in response to the second divided voltage and a second reference voltage whose level decreases with a decrease in the internal voltage.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
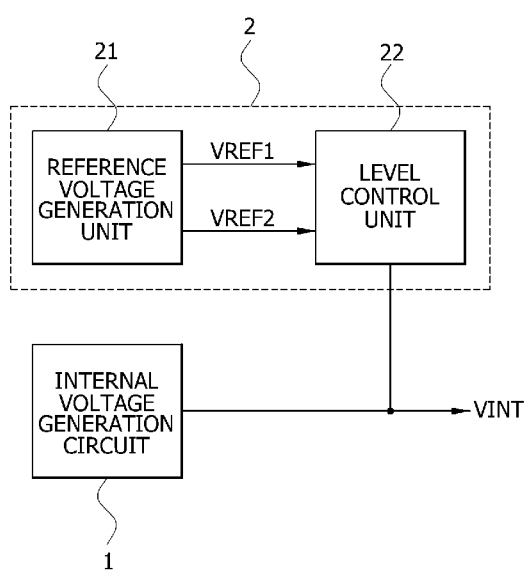
FIG. 1 is a block diagram of a semiconductor memory device in accordance with an embodiment of the present invention.

FIG. 1 is a block diagram of a semiconductor memory device in accordance with an embodiment of the present invention.

Referring to FIG. 1, the semiconductor memory device in accordance with an embodiment of the present invention includes an internal voltage generation circuit 1 and an internal voltage control circuit 2. The internal voltage generation circuit 1 is configured to generate an internal voltage VINT, and the internal voltage control circuit 2 is configured to control the internal voltage VINT such that the absolute value of the internal voltage VINT decreases with decreasing internal temperature. Here, the internal voltage VINT may be used as a negative word line voltage which has a negative level and is applied to an unselected word line.

The internal voltage control circuit 2 includes a reference voltage generation unit 21 and a level control unit 22. The reference voltage generation unit 21 is configured to generate a first reference voltage VREF1 whose level increases with decreasing internal temperature and a second reference voltage VREF2 whose level decreases with decreasing internal temperature. The level control unit 22 is configured to control the level of the internal voltage VINT in response to the first and second reference voltages VREF1 and VREF2.

Figure 2:
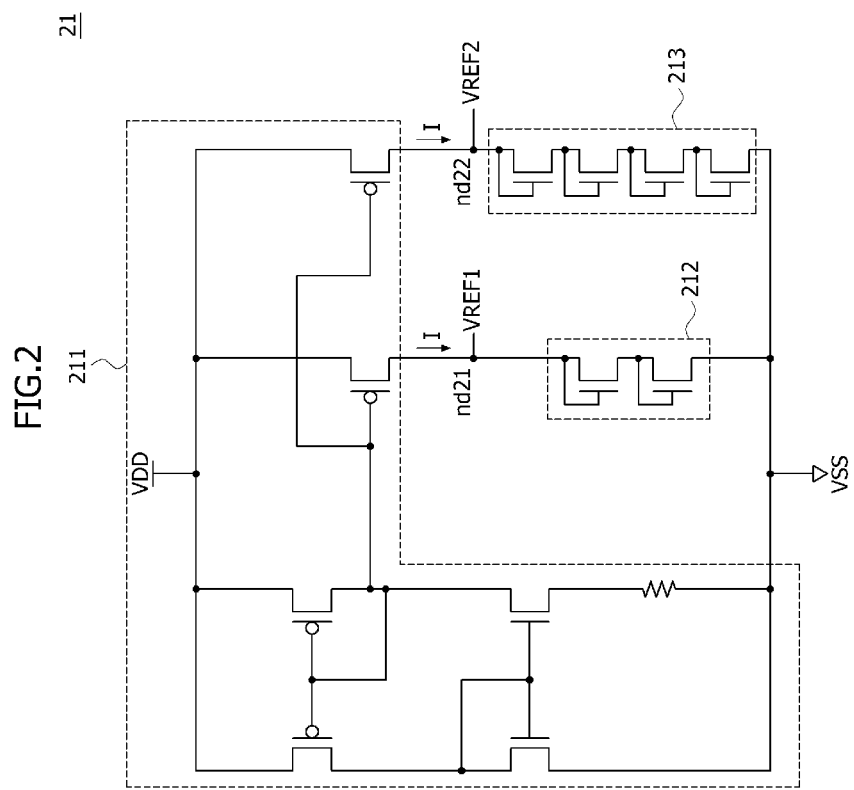
FIG. 2 is a circuit diagram of a reference voltage generation unit included in the semiconductor memory device of FIG. 1.

Referring to FIG. 2, the reference voltage generation unit 21 includes a constant current source 211, a first level setting section 212, and a second level setting section 213. The constant current source 211 may be implemented as a Widlar type current source which includes a MOS transistor and a resistor element having reverse current characteristics and generates a constant current I. According to an example, the first level setting section 212 and the second level setting section 213 include two diodes and four diodes, respectively, and are configured to control the first reference voltage VREF1 and the second reference voltage VREF2, respectively, according to the temperature.

Figure 3:
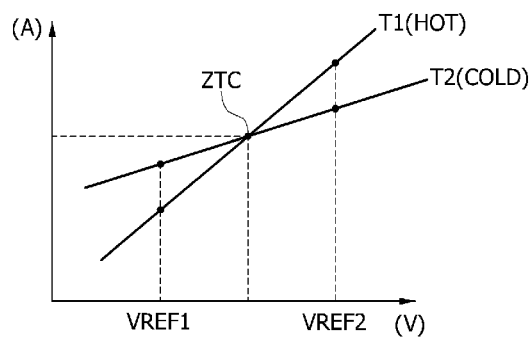
FIG. 3 is a graph showing temperature characteristics of reference voltages generated by the reference voltage generation unit of FIG. 2.

Referring to FIG. 3, it is possible to check the temperature characteristics of the first and second reference voltages VREF1 and VREF2. The level of the first reference voltage VREF1 increases with decreasing temperature, due to the characteristic of the diodes of the first level setting section 212 in which a current at temperature T2 is larger than at temperature T1. Furthermore, the level of the second reference voltage VREF2 increases with increasing temperature, due to the characteristic of the diodes of the second level setting section 213 in which a current at temperature T1 is larger than at temperature T2. Here, the temperature T1 may be set to be higher than the temperature T2, and the level of the second reference voltage VREF2 may be set to be higher than the first reference voltage VREF1. A zero temperature coefficient (ZTC) indicates a point where the current characteristics of the first and second level setting sections 212 and 213 have no relation with temperature.

Figure 4:
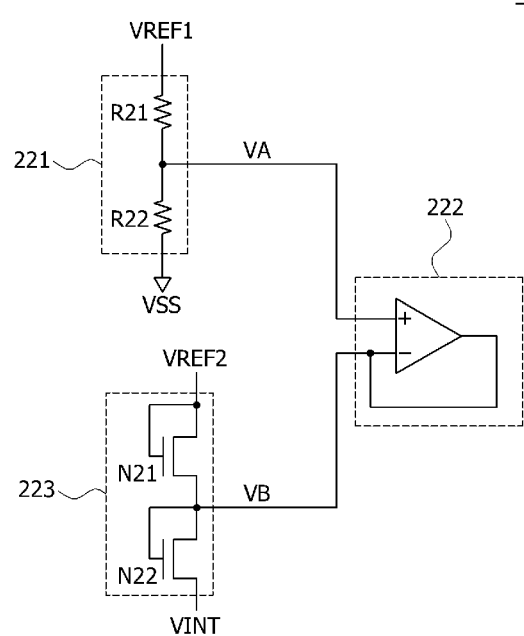
FIG. 4 is a circuit diagram of a level control unit included in the semiconductor memory device of FIG. 1.

Referring to FIG. 4, the level control unit 22 includes a first voltage division section 221, a divided voltage control section 222, and a second voltage division section 223. The first voltage division section 221 is configured to divide the first reference voltage VREF1 according to a ratio of resistance values of resistors R21 and R22 and generate a first divided voltage VA. The divided voltage control section 222 may be implemented as an operational amplifier (OP amp) having a negative (−) input terminal to which a second divided voltage VB is inputted and a signal of an output terminal is fed back to the negative (−) input terminal, and configured to maintain the levels of the first and second divided voltages VA and VB to the same level. The second voltage division section 223 may include NMOS transistors N21 and N22 operating as diodes and is configured to control the level of the internal voltage VINT such that a voltage difference between the second reference voltage VREF2 and the second divided voltage VB is equalized to a voltage difference between the second divided voltage VB and the internal voltage VINT.

Now, the operation of the internal voltage control circuit 2 included in the semiconductor memory device in accordance with an embodiment of the present invention will be described. The operation may be divided in a case where the internal temperature increases and a case where the internal temperature decreases.

The operation of the internal voltage control circuit 2 in the case where the internal temperature increases will be described as follows.

First, the reference voltage generation unit 21 generates the first reference voltage VREF1 whose level decreases with increasing internal temperature and the second reference voltage VREF2 whose level increases with increasing internal temperature.

Then, the first voltage division section 221 included in the level control unit 22 divides the first reference voltage VREF1 whose level decreased and generates the first divided voltage VA whose level decreased.

The divided voltage control section 222 included in the level control unit 22 adjusts the second divided voltage VB and the first divided voltage VA so as to have the same level as each other. Therefore, the second divided voltage VB decreases to the same level as the first divided voltage VA.

The second voltage division section 223 included in the level control unit 22 controls the level of the internal voltage VINT such that a voltage difference between the second reference voltage VREF2 and the second divided voltage VB is equalized to a voltage difference between the second divided voltage VB and the internal voltage VINT. Here, since the level of the second reference voltage VREF2 increased and the level of the second divided voltage VB decreased, the voltage difference between the second reference voltage VREF2 and the second divided voltage VB increases. Therefore, the second voltage division section 223 lowers the level of the internal voltage VINT, in order to increase the voltage difference between the second divided voltage VB and the internal voltage VINT. Therefore, when the internal voltage VINT is a negative word line voltage having a negative level, the absolute value of the internal voltage VINT increases.

The operation of the internal voltage control circuit 2 in the case where the internal temperature decreases will be described as follows.

First, the reference voltage generation unit 21 generates the first reference voltage VREF1 whose level increases with decreasing internal temperature and the second reference voltage VREF2 whose level decreases with decreasing internal temperature.

Then, the first voltage division section 221 included in the level control unit 22 divides the first reference voltage VREF1 whose level increased and generates the first divided voltage VA whose level increased.

The divided voltage control section 222 included in the level control unit 22 adjusts the second divided voltage VB and the first divided voltage VA so as to have the same level as each other. Therefore, the second divided voltage VB increases to the same level as the first divided voltage VA.

The second voltage division section 223 included in the level control unit 22 controls the level of the internal voltage VINT such that a voltage difference between the second reference voltage VREF2 and the second divided voltage VB is equalized to a voltage difference between the second divided voltage VB and the internal voltage VINT. Here, since the level of the second reference voltage VREF2 decreased and the level of the second divided voltage VB increased, the voltage difference between the second reference voltage VREF2 and the second divided voltage VB decreases. Therefore, the second voltage division section 223 increases the level of the internal voltage VINT, in order to reduce the voltage difference between the second divided voltage VB and the internal voltage VINT. Therefore, when the internal voltage VINT is a negative word line voltage having a negative level, the absolute value of the internal voltage VINT decreases.

In accordance with an embodiment of the present invention, the internal voltage control circuit 2 included in the semiconductor memory device increases the absolute value of the internal voltage VINT when the temperature increases, and reduces the absolute value of the internal voltage VINT when the temperature decreases. Therefore, when the internal voltage control circuit 2 included in the semiconductor memory device is applied to generate a negative word line voltage, the absolute value of the negative word line voltage at low temperature may be increased to thereby reduce a leakage current (e.g., a leakage current occurring in a bridge between a word line and a bit line). Through this operation, it is possible to improve a refresh characteristic.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
    a reference voltage generation unit configured to generate first and second reference voltages,
    wherein a level of the first reference voltage increases with decreasing internal temperature, and a level of the second reference voltage decreases with decreasing internal temperature; and
    a level control unit configured to control an internal voltage in response to the first and second reference voltages so as to decrease the absolute value of the internal voltage.

2. The semiconductor memory device of claim 1, wherein the reference voltage generation unit comprises:
    a constant current source configured to compensate for a change in the internal temperature and generate a constant current;
    a first level setting section configured to receive the constant current and set the level of the first reference voltage; and
    a second level setting section configured to receive the constant current and set the level of the second reference voltage.

3. The semiconductor memory device of claim 2, wherein the first level setting section comprises one or more diodes coupled between a ground voltage and a first node from which the first reference voltage is outputted.

4. The semiconductor memory device of claim 3, wherein the second level setting section comprises diodes coupled between the ground voltage and a second node from which the second reference voltage is outputted, and has a larger resistance value than the first level setting section.

5. The semiconductor memory device of claim 1, wherein the level control unit comprises:
    a first voltage division section configured to divide the first reference voltage and generate a first divided voltage;
    a second voltage division section configured to divide the second reference voltage and generate a second divided voltage; and
    a divided voltage control section configured to control a level of the second divided voltage to the same level as the first divided voltage, wherein the second voltage division section controls the level of the internal voltage in response to the second divided voltage.

6. The semiconductor memory device of claim 5, wherein the first voltage division section generates the first divided voltage by dividing the first reference voltage at a ratio of resistance values of resistors coupled between the first reference voltage and a ground voltage.

7. The semiconductor memory device of claim 5, wherein the divided voltage control section comprises an operational amplifier (OP-amp) having a negative (−) input terminal to which the second reference voltage is inputted and a signal of an output terminal is fed back to the negative (−) input terminal.

8. The semiconductor memory device of claim 5, wherein the second voltage division section controls the level of the internal voltage such that a voltage difference between the second reference voltage and the second divided voltage is equalized to a voltage difference between the second divided voltage and the internal voltage.

9. The semiconductor memory device of claim 8, wherein the second voltage division section comprises:
    a first diode coupled between the second reference voltage and the second divided voltage; and
    a second diode coupled between the second divided voltage and the internal voltage.

10. The semiconductor memory device of claim 1, further comprising an internal voltage generation circuit configured to generate the internal voltage which has a negative level and is applied to an unselected word line.

11. A semiconductor memory device comprising:
    an internal voltage generation circuit configured to generate an internal voltage which has a negative level and is applied to an unselected word line; and
    an internal voltage control circuit configured to control the internal voltage such that the absolute value of the internal voltage decreases with decreasing internal temperature, in response to first and second reference voltages, wherein a level of the first reference voltage increases with decreasing internal temperature, and a level of the second reference voltage decreases with decreasing internal temperature.

12. The semiconductor memory device of claim 11, wherein the internal voltage control circuit comprises:
    a reference voltage generation unit configured to generate the first and second reference voltages; and
    a level control unit configured to control the level of the internal voltage according to the internal temperature, in response to the first and second reference voltages.

13. The semiconductor memory device of claim 12, wherein the reference voltage generation unit comprises:
    a constant current source configured to compensate for a change in the internal temperature and generate a constant current;
    a first level setting section configured to receive the constant current and set the level of the first reference voltage; and
    a second level setting section configured to receive the constant current and set the level of the second reference voltage.

14. The semiconductor memory device of claim 13, wherein the first level setting section comprises one or more diodes coupled between a ground voltage and a first node from which the first reference voltage is outputted.

15. The semiconductor memory device of claim 14, wherein the second level setting section comprises diodes coupled between the ground voltage and a second node from which the second reference voltage is outputted, and has a larger resistance value than the first level setting section.

16. The semiconductor memory device of claim 12, wherein the level control unit comprises:
    a first voltage division section configured to divide the first reference voltage and generate a first divided voltage;
    a second voltage division section configured to divide the second reference voltage and generate a second divided voltage; and
    a divided voltage control section configured to control a level of the second divided voltage to the same level as the first divided voltage, wherein the second voltage division section controls the level of the internal voltage in response to the second divided voltage.

17. The semiconductor memory device of claim 16, wherein the first voltage division section generates the first divided voltage by dividing the first reference voltage at a ratio of resistance values of resistors coupled between the first reference voltage and a ground voltage.

18. The semiconductor memory device of claim 16, wherein the divided voltage control section comprises an OP-amp having a negative (−) input terminal to which the second reference voltage is inputted and a signal of an output terminal is fed back to the negative (−) input terminal.

19. The semiconductor memory device of claim 16, wherein the second voltage division section controls the level of the internal voltage such that a voltage difference between the second reference voltage and the second divided voltage is equalized to a voltage difference between the second divided voltage and the internal voltage.

20. The semiconductor memory device of claim 19, wherein the second voltage division section comprises:
    a first diode coupled between the second reference voltage and the second divided voltage; and
    a second diode coupled between the second divided voltage and the internal voltage.

21. A semiconductor memory device comprising:
    a first voltage division section configured to divide a first reference voltage and generate a first divided voltage, wherein a level of the first reference voltage increases with decreasing internal temperature;
    a second voltage division section configured to divide a second reference voltage and generate a second divided voltage, wherein a level of the second reference voltage decreases with decreasing internal temperature; and
    a divided voltage control section configured to control a level of the second divided voltage to the same level as the first divided voltage, wherein the second voltage division section controls the level of the internal voltage in response to the second divided voltage.

22. The semiconductor memory device of claim 21, wherein the first voltage division section generates the first divided voltage by dividing the first reference voltage at a ratio of resistance values of resistors coupled between the first reference voltage and a ground voltage.

23. The semiconductor memory device of claim 21, wherein the divided voltage control section comprises an OP-amp having a negative (−) input terminal to which the second reference voltage is inputted and a signal of an output terminal is fed back to the negative (−) input terminal.

24. The semiconductor memory device of claim 21, wherein the second voltage division section controls the level of the internal voltage such that a voltage difference between the second reference voltage and the second divided voltage is equalized to a voltage difference between the second divided voltage and the internal voltage.

25. The semiconductor memory device of claim 24, wherein the second voltage division section comprises:
    a first diode coupled between the second reference voltage and the second divided voltage; and
    a second diode coupled between the second divided voltage and the internal voltage.

* * * * *